United States Patent [19]

Crane

[11] Patent Number: 4,766,402

[45] Date of Patent: Aug. 23, 1988

[54] APPARATUS FOR MATCHING UNBALANCED R. F. BASEBAND SIGNALS TO BALANCED SIGNALS ON A TWISTED TWO-WIRE LINE

[75] Inventor: Ronald C. Crane, Mountain View, Calif.

[73] Assignee: 3COM Corporation, Santa Clara, Calif.

[21] Appl. No.: 83,499

[22] Filed: Aug. 6, 1987

[51] Int. Cl.$^4$ .............................................. H03H 7/42
[52] U.S. Cl. ........................................ 333/25; 375/36; 379/93
[58] Field of Search ...................... 333/25, 26; 379/93, 379/442; 375/36

[56] References Cited

U.S. PATENT DOCUMENTS

| | | | |
|---|---|---|---|
| 3,812,292 | 5/1974 | Tink et al. | 375/36 X |
| 4,201,962 | 5/1980 | Hosoya | 333/25 |
| 4,717,896 | 1/1988 | Graham | 333/25 |

Primary Examiner—Paul Gensler
Attorney, Agent, or Firm—Townsend & Townsend

[57] ABSTRACT

Impedance of each termination in a wiring environment, wherein unshielded twisted pair wires with a characteristic impedance at 10 MHz of about 85 to 130 ohms are used as a communication medium for a local area network where run lengths do not exceed about 250 feet between terminations, is matched at each termination by an impedance matching termination and line conditioning apparatus, hereinafter a matching device. The matching device matches impedance of twisted pair wiring to a nominal 50 termination over a bandwidth of d.c. to above about 10 MHz. The matching device comprises a low-pass filter coupled at a first port to a fifty-ohm standard BNC connector and at a second port to a tapped autotransformer means with a d.c. blocking capacitor for impedance matching and balanced to unbalanced conversion, which in turn is coupled to a common mode inductor, which in turn is coupled to terminals for each side of a twisted pair cable. The common mode inductor is for passing differential signals over the entire frequency spectrum while rejecting all common mode signals over substantially all of the frequency spectrum.

13 Claims, 3 Drawing Sheets

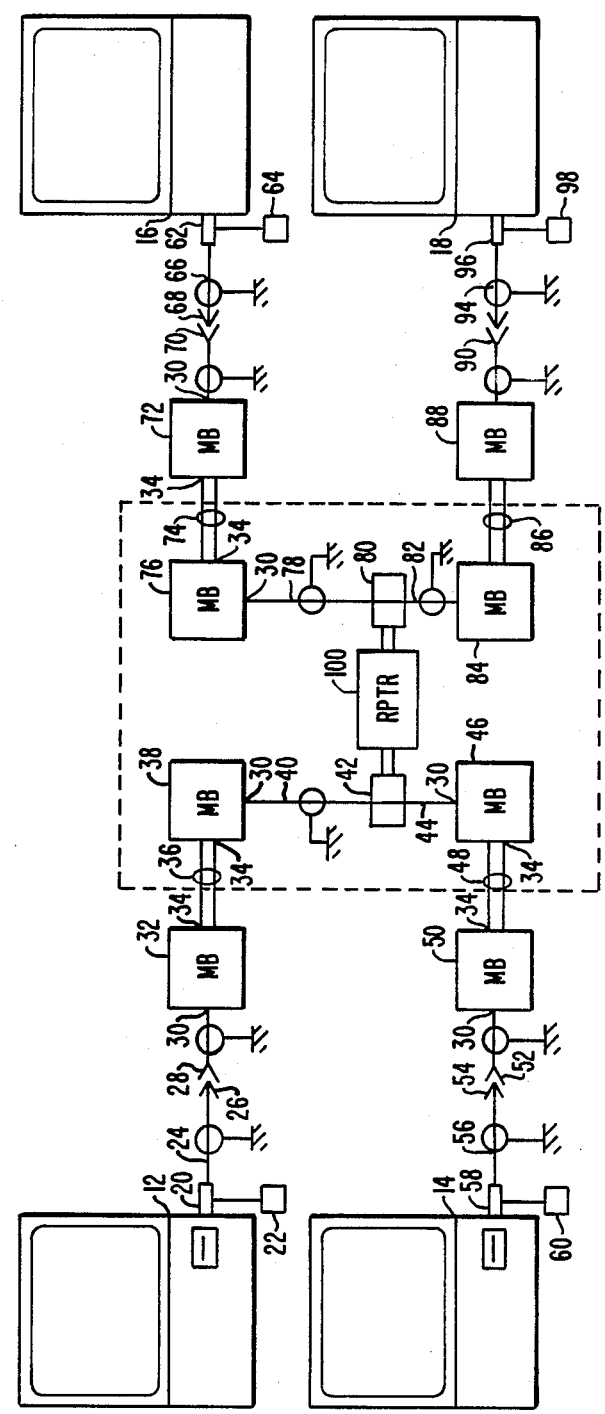
FIG._1.

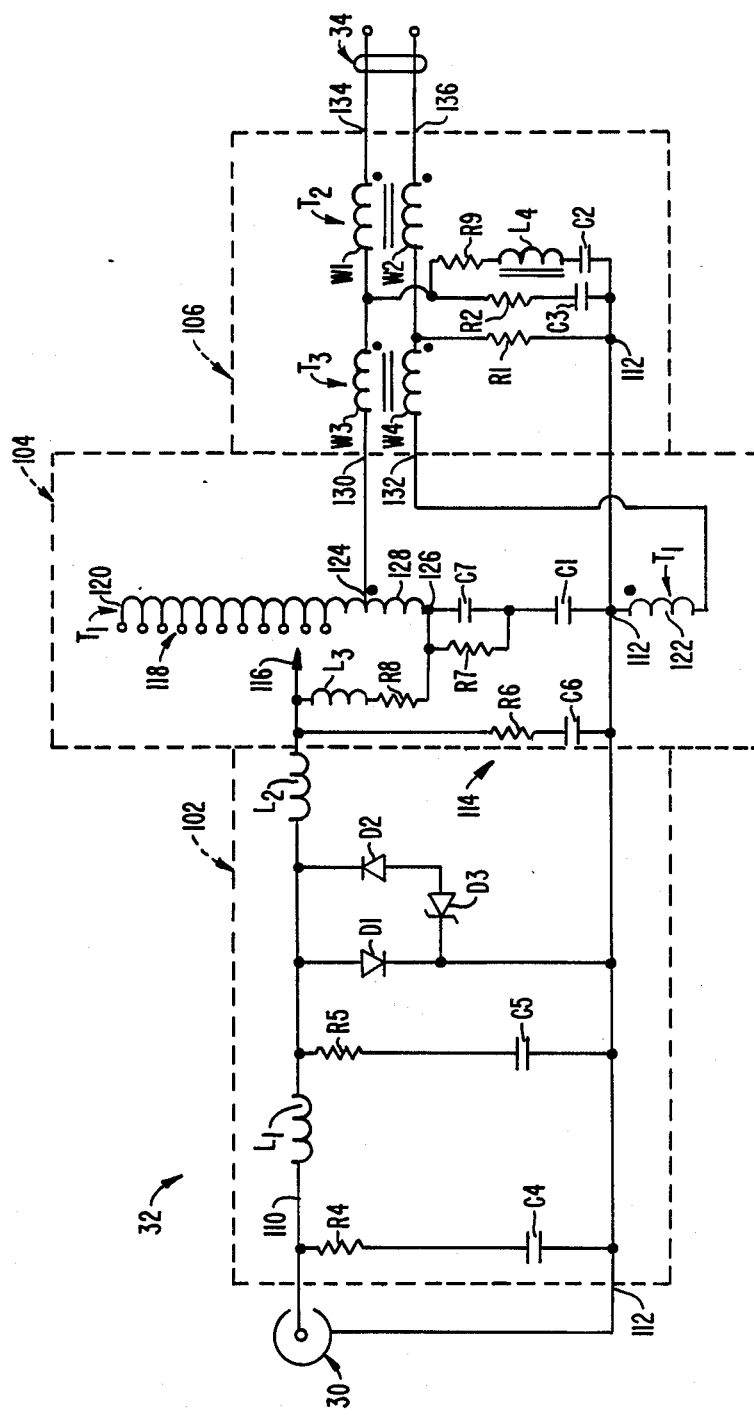
FIG._2.

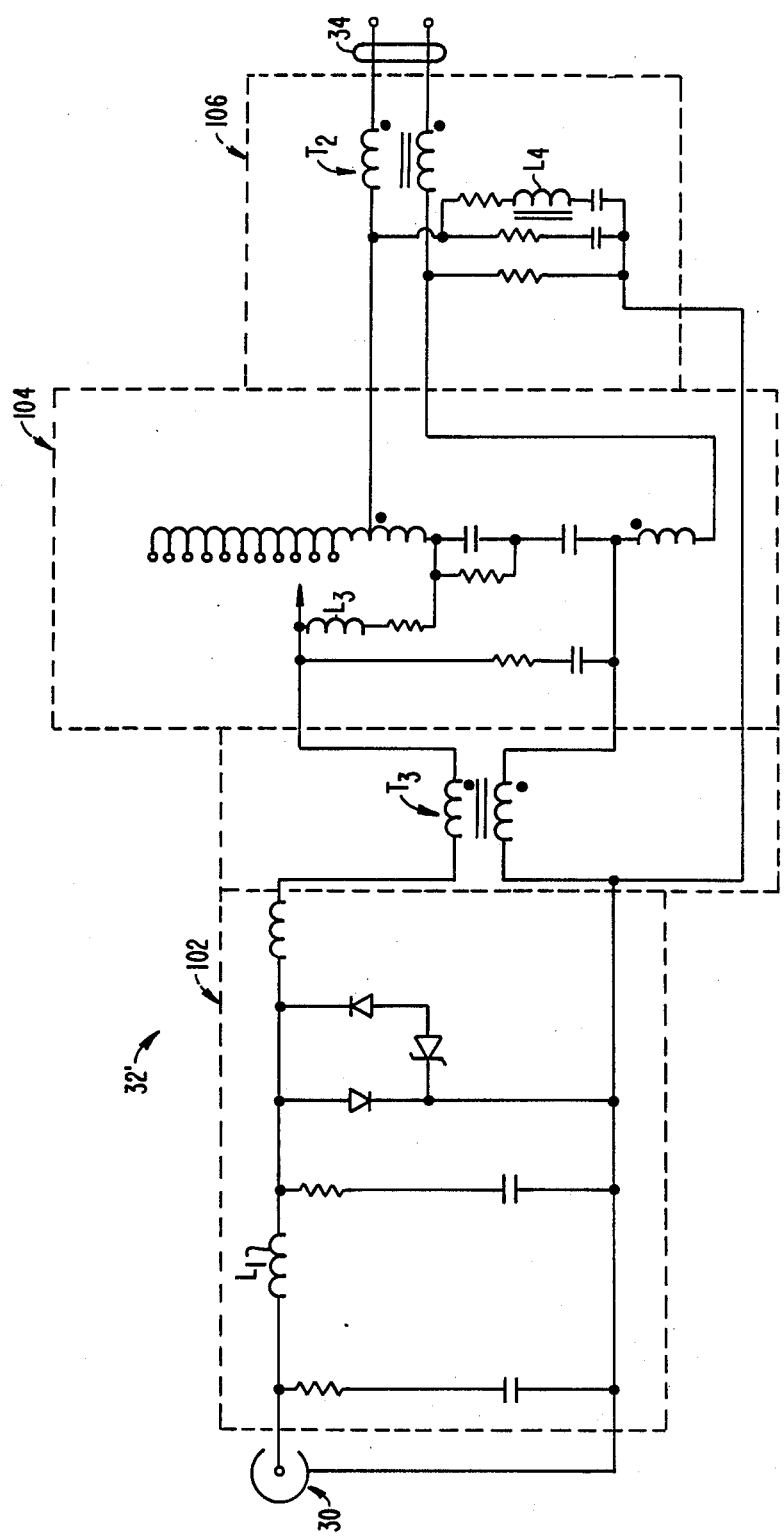
FIG._3.

APPARATUS FOR MATCHING UNBALANCED R. F. BASEBAND SIGNALS TO BALANCED SIGNALS ON A TWISTED TWO-WIRE LINE

BACKGROUND OF THE INVENTION

This invention relates to digital communication over two-wire twisted pair telephone lines in the environment of a local area network, and more particularly this invention relates to the transmission of signals in accordance with IEEE Standard 802.3 (Ethernet) signals of a bandwidth in the range of d.c. to greater than about 4 MHz and preferably greater than about 10 MHz and less than about 20 MHz over an unshielded 24 gauge typical twisted pair of telephone wires within the walls of an office.

One of the challenges of office communications is to be able to communicate data signals from d.c. to over 10 MHz data rate through available office wiring without signal reflections. Passing unbalanced signals at d.c. and low frequencies is particularly challenging in a broad bandwidth medium. What is therefore needed is an apparatus which provides signal matching of unbalanced signals to balanced signals to allow runs of twisted pair wires to replace runs of coaxial cable in an office environment.

Prior proposed solutions to the problem of transmitting signals over telephone-type twisted pair wiring in the speed range of interest (over 1 MBS) have involved expensive construction with active components or non-bus approaches (STARLAN, IBM Token Ring on baseband twisted pair, Synoptics ASTRANET, ONAN Type 3 Media filter for IBM Token Ring on baseband twisted pair, MUX LABS 3270 Coax Replacements) in order to avoid the problem and difficulties of measuring high frequency impedance as well as the problem of matching disparate impedances of various types of wiring. The MUX LABS 3270 Coax Replacement (from MUX LABS of Montreal, Quebec, Canada) employs a simple one-to-one isolation transformer which is incapable of passing d.c. This device is intended only for use in point-to-point connections. The ONAN Type 3 Media Filter (from ONAN Power Electronics of Minneapolis, Minnesota provides a rudimentary low-pass filter and common mode rejection transformers for a 4 MBS Token Ring (IEEE 802.5) System. However, the ONAN device was apparently designed with certain assumptions which do not apply to the matching of twisted pair wiring to coaxial cable. For example, the design appears to assume balanced connections and an impedance match at the transmit terminal of the ring. What is needed is a simple, low-cost bus-type (single-pair) wiring solution for a local area network application capable of matching IEEE Standard 802.3 (Ethernet) 50-ohm unbalanced signals to a substantially balanced pair of telephone type wires of unknown impedance in the 50-ohm to 200-ohm range.

SUMMARY OF THE INVENTION

According to the invention, in a wiring environment wherein unshielded twisted pair wires with a characteristic impedance at 10 MHz of about 85 to 130 ohms are used as a communication medium for a local area network where run lengths do not exceed about 250 feet between terminations, impedance of each termination is measured at each termination at the time of installation or removal of any fixed termination, and an accurate impedance match is installed at each termination to match the impedance of the balanced wire medium to the impedance of the unbalanced medium to be coupled to a terminal. Impedance matching at the time of installation makes it possible to install simple and inexpensive though accurate impedance matching devices at each termination. Further according to the invention, an impedance matching termination and line conditioning apparatus, hereinafter a matchbox, is provided which matches impedance of twisted pair wiring to a nominal fifty-ohm termination over a bandwidth of d.c. to above about 10 MHz. The matching device comprises a low-pass filter coupled at a first port to a fifty-ohm standard BNC connector and at a second port to a tapped auto-transformer means with a d.c. blocking capacitor (to prevent shorting of the d.c. component of the signal) for impedance matching and balanced to unbalanced conversion, which in turn is coupled to a common mode inductor, which in turn is coupled to terminals for each side of a twisted pair cable. The common mode inductor is for passing differential signals over the entire frequency spectrum while rejecting all common mode signals over substantially all of the frequency spectrum.

A simple impedance measuring tool provides an accurate but inexpensive means for determining impedance and assuring an impedance match in the installation environment.

The invention will be better understood by reference to the following detailed description in conjunction with the accompanying drawings.

BRIEF DESCRIPTION OF THE DRAWINGS

FIG. 1 is a block diagram of a local area network in accordance with the invention.

FIG. 2 is a schematic diagram of a first impedance matching device according to the invention.

FIG. 3 is a schematic diagram of a second impedance matching device according to the invention.

DESCRIPTION OF SPECIFIC EMBODIMENTS

Referring to FIG. 1, there is shown a block diagram of one configuration of local area network 10 in accordance with the invention. This configuration is merely to illustrate the environment of the media, since many other configurations are contemplated. It should be understood that the type of wiring media directly affects the performance of the local area network circuit.

In the specific embodiment of FIG. 1, a plurality of personal computers 12, 14, 16 and 18 may be coupled together in a hybrid twisted pair and coaxial network structure wherein run lengths between terminations does not exceed a length predetermined by the maximum allowable d.c. loop resistance or maximum allowable a.c. attenuation of the media. In a typical system, the maximum run length may not exceed about 250 feet for a single 24 gauge twisted pair. It is possible to extend the run length within the a.c. limit and the d.c. limit by reducing the d.c. loop resistance with two pairs of 24 gauge twisted pairs electrically connected in parallel through a suitable parallel coupling).

For example, a first personal computer 12 is coupled at first coaxial tee connector 20 which itself is terminated by a first terminator 22. The first coaxial tee connector 20 is coupled to a first coaxial cable segment 24, which in turn is coupled to a first coaxial plug 26. The first coaxial plug 26 is coupled to a first coaxial jack 28 at an unbalanced port 30 of a first matching device 32 in accordance with the invention. A balance port 34 is provided for connection to a first twisted pair segment 36. The first twisted pair segment 36 is substantially balanced and has a characteristic impedance sufficiently different from the characteristic impedance of the coaxial segments that significant signal reflections would occur at r.f. frequencies of interest if no matching were provided. The first twisted pair segment 36 is connected to a second matching device 38, also having an unbalanced port 30 and balanced port 34. The unbalanced port of the second matching device 38 is coupled to a second coax segment 40, which in turn is coupled at a high impedance tap (a tee connector) to a first transceiver 42. A third coaxial segment 44 is coupled to a third matching device 46. The third matching device 46 is coupled through a second twisted pair segment 48 of a substantial run length to a fourth matching device 50. The fourth matching device 50 is coupled at its unbalanced port 30 to a coaxial jack 52. The coaxial jack 52 is coupled to a coaxial plug 54 on a fourth coaxial segment 56, coupled to a tee connector 58, which is terminated by a terminator 60. The tee connector 58 is coupled to the second personal computer 14.

A parallel coupling is provided on a separate run. A third personal computer 16 is coupled at coaxial tee connector 62 which itself is terminated by a terminator 64. The coaxial tee connector 62 is coupled to a fifth coaxial cable segment 66, which in turn is coupled to a coaxial plug 68. The coaxial plug 68 is coupled to a coaxial jack 70 at an unbalanced port 30 of a fifth matching device 72 in accordance with the invention. A balance port 34 is provided for connection to a third twisted pair segment 74. The third twisted pair segment 74 is substantially balanced and has a characteristic impedance sufficiently different from the characteristic impedance of the coaxial segments that significant signal reflections would occur at r.f. frequencies of interest if no matching were provided. The third twisted pair segment 74 is connected to a sixth matching device 76, also having an unbalanced port 30 and balanced port 34. The unbalanced port 30 of the sixth matching device 76 is coupled to a sixth coax segment 78, which in turn is coupled at a high impedance tap (a tee connector) to a second transceiver 80. A third coaxial segment 82 is coupled to a seventh matching device 84. The seventh matching device 84 is coupled through a second twisted pair segment 86 of a substantial run length to an eighth matching device 88. The eighth matching device 88 is coupled at its unbalanced port to a coaxial jack 90. The coaxial jack 90 is coupled to a coaxial plug on a fourth coaxial segment 94, coupled to a tee connector 96, which is terminated by a terminator 98. The tee connector 96 is coupled to the fourth personal computer 18. The two terminated segments may be linked together through a repeater 100 coupled to the transceivers 42 and 80 as is conventional for an Ethernet intersegment link. The repeater 100, the transceivers 42 and 80 and the matching devices 38, 46, 76 and 84 are conveniently located in a telephone wiring closet at a central location in a building. The twisted pair segments 36, 48, 74 and 86 provide the greatest length of the signal path, while the couplings at the personal computers appear to be coaxial cabling into for example a wall box in a room. Within the wiring closet, coaxial cable may be employed to interconnect the network interconnection system for the wiring runs in each loop of the bus system. The transceivers 42 and 80 and the repeater 100 are conventional interconnection devices in a local area network. In accordance with the invention, a matching device 32 in accordance with the invention is employed in connection with other matching devices to provide a coupling for cabling thereby to serve as a direct substitution for a coaxial cable run.

Referring to FIG. 2, there is shown a first preferred embodiment of a matching device 32 in accordance with the invention. The matching device 32 comprises three sections, namely a low-pass filter section 102 having a first or unbalanced port 30, an autotransformer section 104 and a common mode current rejection section 106 having a second or balanced port 34.

The common mode current rejection section 106 provides, simultaneously, d.c. passthrough, high common mode impedance at signal frequencies (1 MHz to 10 MHz) and at low to mid-range frequencies (10 kHz to 500 kHz), and inductive current cancellation. The autotransformer section 104 provides adjustable impedance matching and unbalanced signal to balanced signal conversion.

The low-pass filter section 102 provides reliable rejection of residual spurious r.f. signals which might be present at the unbalanced input port 30, as well as overvoltage protection against the possibility that undesired voltage might be present on the balanced side which could damage delicate circuitry connected to the unbalanced side.

The low-pass filter section 102 comprises a linear phase passive L-C filter comprising a first inductor L1 and a first capacitor C4 looking into a characteristic resistive impedance of 50 Ohms at the unbalanced port 30, the unbalanced port having a center conductor side 110 and a common node 112. A first resistor R4 set at 50 Ohms in series with the capacitor C4 across the unbalanced port 30 assures the load impedance at high frequencies remains at the desired characteristic impedance. A second resistor R5 is provided in series with a second capacitor C5 between the first inductor L1 and the common node 112. A second inductor L2 is coupled from the first inductor L1 a second port at the autotransformer section 104, terminating across a fixed high frequency load 114 (resistor R6 and capacitor C6) and in a primary tap 116. Overvoltage protection is provided by diodes D1, D2 and Zener diode D3 from L1 and L2 to the common node 112. The parasitic capacitance of the diodes contribute to the capacitance values of the low-pass filter section 102.

The autotransformer section 104 includes the fixed high-frequency load 114 of R6 and C6, an autotransformer coil 118 having a large multiple-tap winding 120 and a smaller, isolated winding 122, the large tapped winding having a first tap 124 at a point relative to a reference node 126 which has an equal number of turns as the isolated winding 122 thereby to define an output portion 128 on a center conductor side 130 of the common mode current rejection section 106. The polarity of the isolated winding 122 matches the polarity of the large winding 120 (as indicated by polarity dots). The isolated winding 122 is coupled at one end to the common node 112 and at the other end to a signal common side 132 of the common mode current rejection section 106. The multiple-tap winding 120 has a plurality of tap connections at for example every turn for connection of the primary tap 116 to the winding 120. The preferable tap connection increment is to provide an eight percent change in impedance in order to assure that it is possible to attain an impedance match within a desired tolerance for impedance matching of plus or minus four percent.

A d.c. blocking capacitor C1 is provided between the common node 112 (at the winding 122) and the base 126 of the output portion 128 through a first compensation resistor R7. The value of the first compensation resistor R7 is in the low hundred ohm range. The primary tap 116 is provided with a coupling through a third inductor L3 and a second compensation resistor R8 to the base 126. A high frequency compensation capacitor C7 is coupled between the base 126 and the blocking capacitor C1 to minimize high frequency attenuation between the unbalanced port 30 and balanced port 34. The combination of the d.c. blocking capacitor C1 and the third inductor L3 determines the transition frequency above which impedance matching occurs. The combination of the compensation capacitor C7 and compensation resistors R7 and R8 provides damping to minimize ringing in response to step changes in applied voltage.

The common mode current rejection section 106 having balanced port 34 on one side and center conductor side 130 and signal common side 132 has in a first preferred embodiment a first transformer T2 and a second transformer T3, the first transformer T2 having a first winding W1 and a second winding W2. The first winding W1 is coupled to a first balanced port terminal 134 on the center conductor side 130 to pass differential signals to the first terminal 134 of the balanced port 34 connector, and the second winding W2 is coupled to a second terminal 136 of the balanced port 34 connector on the signal common side 132 to pass differential signals. The first transformer T2 is for providing a large common mode impedance at high-range frequencies above about 1 MHz.

The second transformer T3 has a third winding W3 and a fourth winding W4. The third winding W3 is coupled on the center conductor side 130 to the first winding W1 to pass differential signals to said first winding W1, and the fourth winding W4 is coupled to the second winding W2 on the signal common side 132 to pass differential signals to said second winding W2. The second transformer W3 is for providing a large common mode impedance at midrange frequencies between about 10 kHz and about 1 MHz.

A fourth inductor L4 is coupled in series with a resistor R9 and second d.c. blocking capacitor C2 between the center conductor side of the first winding W1 and the common node 112 of the unbalanced port 30, the fourth inductor having an inductance value matched to the inductance value of the third winding W3, for diverting current from the third winding W3 to cancel common mode offset current in the third winding W3.

Further, the common mode current rejection section 106 has a first resistor R1, a second resistor R2 and a first coupling capacitor C3. The first resistor R1 is coupled between the signal common side 132 of said second winding W2 and the common node 112. The second resistor R2 is coupled between the center conductor side 130 of said first winding W1 and the common node 112 through the first coupling capacitor C3 for reducing effects of capacitively-coupled noise from external sources through the balanced port 34.

FIG. 3 illustrates a matching device 32' in accordance with a second preferred embodiment of the invention. This embodiment differs from the embodiment of FIG. 2 in that the second transformer T3 is coupled between the low-pass filter section 102 and the autotransformer section, and it would therefore not appear as an explicit part of the common mode current rejection section 106. However, its electrical function is exactly the same as in the embodiment of FIG. 2 in that it provides high common mode impedance to midrange frequencies. The advantage of placement of the second transformer T3 at the second port of the low-pass filter section 102 is two-fold. First, the long length of wire in the transformer windings, the impedance of which is fixed, does not need to change value with change in tap setting of the autotransformer. Second, the impedance at the second port of the low-pass filter section 102 is much lower than adjacent the first transformer T2, and as a consequence standard bifilar magnet wire may be employed for its windings with ready match to the characteristic impedance of 50 Ohms at the second port.

The invention has now been explained with reference to specific embodiments. Other embodiments will be apparent to those of ordinary skill in this art. Therefore, it is not intended that this invention be limited, except as indicated by the appended claims.

I claim:

1. An apparatus for coupling an unbalanced termination of a first characteristic impedance to a substantially balanced termination of a second characteristic impedance with matching from d.c. to above about 10 MHz comprising:

a low-pass filter means for limiting bandwidth to a system passband, said low-pass filter means coupled at a first filter port to a first connector suited for termination in an unbalanced line of said first characteristic impedance and at a second port coupled to an autotransformer means, said unbalanced line having a center conductor coupled to a center conductor side and a signal common coupled to a common node;

autotransformer means with a first d.c. blocking capacitor coupled to said common node for impedance matching and for balanced to unbalanced signal conversion; and a common mode inductor means for providing common mode rejection over a bandwidth up to at least said system passband, said common mode inductor means to be coupled to a second connector suited for termination in a substantially balanced line of said second characteristic impedance.

2. The apparatus according to claim 1 wherein said common mode inductor means comprises:

a first transformer, said first transformer having a first winding and a second winding, said first winding being coupled on said center conductor side to pass differential signals to a first terminal of said second connector and said second winding being coupled on a signal common side to pass differential signals to a second terminal of said second connector, said first terminal and said second terminal for direct connection to a twisted pair cable, for providing a large common mode impedance at high-range frequencies above about 1 MHz;

a second transformer comprising a third winding and a fourth winding, said third winding being coupled on said center conductor side to pass differential signals to said first winding, and said fourth winding being coupled on said signal common side to pass differential signals to said second winding, for providing a large common mode impedance at midrange frequencies between about 10 kHz and about 1 MHz; and a first inductance means coupled in series with a second d.c. blocking capacitor between said center conductor side of said first winding and a signal common of said unbalanced conductor, said inductance means having an inductance value matched to the inductance value of said third winding, for diverting current from said third winding to cancel common mode offset current in said third winding.

3. The apparatus according to claim 2 wherein said common mode inductor means further comprises:
a first resistor;
a second resistor; and
a first coupling capacitor;
said first resistor being coupled between said signal common side of said second winding and said common node;
said second resistor being coupled between said center conductor side of said first winding and said signal common through said first coupling capacitor for reducing effects of capacitively-coupled noise from external sources through said second connector.

4. The apparatus according to claim 2 wherein said first transformer and said second transformer each have a differential characteristic impedance matched to the impedance at its insertion point in its signal path.

5. The apparatus according to claim 1 wherein said autotransformer means includes means for selecting a tap to match the characteristic impedance at said first connector with the characteristic impedance at said second connector when said second connector is connected to said substantially balanced termination.

6. The apparatus according claim to 2 wherein said autotransformer means includes means for selecting a tap to match the characteristic impedance at said first connector with the characteristic impedance at said second connector when said second connector is connected to said substantially balanced termination.

7. The apparatus according claim to 5 wherein said autotransformer means comprises an autotransformer, coil and frequency compensation means, said frequency compensation means to minimize high frequency attenuation and to establish a minimum frequency for impedance matching.

8. The apparatus according to claim to 7 wherein said frequency compensation means comprises a second inductance means coupled in parallel with magnetizing inductance of said autotransformer coil and a parallel resistor-capacitor combination coupled between said autotransformer coil and said first d.c. blocking capacitor, wherein the values of said d.c. blocking capacitor and said second inductance means establishes said minimum frequency for impedance matching, and wherein the values of said parallel resistor-capacitor combination control input to output frequency response.

9. The apparatus according to claim to 1 wherein said low-pass filter comprises diode means coupled between said center conductor side and said common node, said diode means for providing voltage clamping between said center conductor side and said common node, said diode means having a parasitic capacitance included as a component of said low-pass filter.

10. The apparatus according claim to 2 wherein said third winding is coupled between said first winding and a first tap of said autotransformer means and said fourth winding is coupled between said second winding and a second tap of said autotransformer means, said second tap being of equal voltage and opposite polarity to said first tap.

11. The apparatus according claim to 2 wherein said third winding is coupled between said second port and a primary tap of said autotransformer means and wherein said fourth winding is coupled between said second port and a common reference of said autotransformer means.

12. The apparatus according to claim to 1 wherein said common mode inductor means further provides common mode rejection from a low frequency limit determined by noise.

13. The apparatus according claim to 2 further including means coupled between a primary tap of said autotransformer means and a common reference of said autotransformer means for compensating for parasitic leakage inductance of said autotransformer means.

* * * * *